US012690479B2

(12) United States Patent
Suenaga et al.

(10) Patent No.: US 12,690,479 B2
(45) Date of Patent: Jul. 21, 2026

(54) SILICON NITRIDE SUBSTRATE, SILICON NITRIDE CIRCUIT SUBSTRATE, AND EVALUATION METHOD, EVALUATION DEVICE, AND EVALUATION SYSTEM FOR SILICON NITRIDE SUBSTRATE AND SILICON NITRIDE CIRCUIT SUBSTRATE

(71) Applicant: Proterial, Ltd., Tokyo (JP)

(72) Inventors: Kazufumi Suenaga, Tokyo (JP); Rei Fukumoto, Tokyo (JP); Youichiro Kaga, Tokyo (JP)

(73) Assignee: Proterial, Ltd., Tokyo (JP)

( * ) Notice: Subject to any disclaimer, the term of this patent is extended or adjusted under 35 U.S.C. 154(b) by 548 days.

(21) Appl. No.: 18/170,170

(22) Filed: Feb. 16, 2023

(65) Prior Publication Data

US 2023/0274992 A1 Aug. 31, 2023

(30) Foreign Application Priority Data

Feb. 25, 2022 (JP) ................................. 2022-028245
Sep. 20, 2022 (JP) ................................. 2022-149016

(51) Int. Cl.
*H10W 70/698* (2026.01)
*C01B 21/068* (2006.01)
(Continued)

(52) U.S. Cl.
CPC ....... *H10W 70/698* (2026.01); *C01B 21/0682* (2013.01); *H10P 74/203* (2026.01);
(Continued)

(58) Field of Classification Search
CPC ... H01L 23/147; H01L 22/12; H01L 23/3736; C01B 21/0682; C01P 2002/82;
(Continued)

(56) References Cited

U.S. PATENT DOCUMENTS 6,197,435 B1 * 3/2001 Tsujimura ........... H01L 23/3735
428/668
10,669,210 B2 6/2020 Imamura et al.
(Continued)

FOREIGN PATENT DOCUMENTS

CN 108495831 A * 9/2018 ............. C04B 35/64
CN 109791876 A * 5/2019 ....... H01L 21/02658
(Continued)

OTHER PUBLICATIONS

Taiwanese Office Action dated Dec. 4, 2024, for corresponding Taiwanese Application No. 112100409.
(Continued)

*Primary Examiner* — Michael P LaPage
*Assistant Examiner* — Kemaya Nguyen
(74) *Attorney, Agent, or Firm* — David D. Brush; Westman, Champlin & Koehler, P.A.

(57) ABSTRACT

A silicon nitride substrate including a first surface, and a second surface disposed opposite the first surface. One of the first surface or the second surface is a measurement surface. On the measurement surface, a value of an average full-width-at-half-maximum (FWHM) $C_{ave}$ is broader than 0 cm$^{-1}$ and narrower than 5.32 cm$^{-1}$ as measured by using a following measurement method. The measurement method of the average full-width-at-half-maximum (FWHM) $C_{ave}$: one central point and four edge portions on the measurement surface are determined as measurement points; a Raman spectrum is measured at each of the measurement points; a full-width-at-half-maximum (FWHM) C of a spectral peak having the maximum strength within a range from 850 cm$^{-1}$ or greater to 875 cm$^{-1}$ or less is calculated in each Raman spectrum; and an average value of thus calculated full-width-at-half-maximum (FWHM)s C is the average full-width-at-half-maximum (FWHM) $C_{ave}$.

7 Claims, 17 Drawing Sheets

(51) Int. Cl.
  *H10P 74/20* (2026.01)
  *H10W 40/25* (2026.01)
(52) U.S. Cl.
  CPC ...... *C01P 2002/82* (2013.01); *C01P 2006/32* (2013.01); *H10W 40/258* (2026.01)
(58) Field of Classification Search
  CPC . C01P 2006/32; G01N 21/94; G01N 21/9501; G01N 21/65; G01N 21/25; C04B 35/584; C04B 2235/9607; C04B 2235/9646; H05K 1/0209; H05K 1/0306
  See application file for complete search history.

(56) References Cited

U.S. PATENT DOCUMENTS

| | | | | |
|---|---|---|---|---|
| 11,614,408 | B2 * | 3/2023 | Zhu | G01N 21/65 356/301 |
| 2008/0086276 | A1 * | 4/2008 | Naka | G01L 1/24 702/43 |
| 2013/0030728 | A1 * | 1/2013 | Kawashima | H01L 22/12 702/56 |
| 2019/0031566 | A1 | 1/2019 | Imamura et al. | |
| 2020/0385887 | A1 | 12/2020 | Okita et al. | |
| 2021/0122680 | A1 | 4/2021 | Aoki et al. | |
| 2022/0244186 | A1 * | 8/2022 | Brueck | G01N 21/6486 |
| 2023/0064942 | A1 * | 3/2023 | Shin | G01N 21/65 |

FOREIGN PATENT DOCUMENTS

| | | | | | |
|---|---|---|---|---|---|
| CN | 110290640 | A | * | 9/2019 | H05K 1/183 |
| CN | 112313191 | A | | 2/2021 | |
| DE | 10248504 | A1 | | 4/2004 | |
| JP | S5891147 | A | | 5/1983 | |
| JP | H09227240 | A | | 9/1997 | |
| JP | 2001146480 | A | | 5/2001 | |
| JP | 2003267786 | A | | 9/2003 | |
| JP | 2005214659 | A | | 8/2005 | |
| JP | 2013182960 | A | | 9/2013 | |
| JP | 2016204206 | A | | 12/2016 | |
| JP | 2016204207 | A | | 12/2016 | |
| JP | 2016204209 | A | | 12/2016 | |
| JP | 2016204210 | A | | 12/2016 | |
| JP | 2018-182960 | A | | 11/2018 | |
| JP | 2018184333 | A | * | 11/2018 | |
| WO | 2017170247 | A1 | | 10/2017 | |
| WO | 2019167337 | A1 | | 9/2019 | |
| WO | 2019235593 | A1 | | 12/2019 | |

OTHER PUBLICATIONS

Japanese Notification of Reasons for Refusal dated Nov. 1, 2022 for corresponding Japanese Application No. 2022-149016.

Chino et al., "Determination of Free Silicon in Sintered Silicon Nitride by Laser Raman Spectrometry", Journal of the Ceramic Society of Japan, 1989, vol. 97, No. 12, pp. 1466-1470 (English Abstract).

Extended European Search Report dated Jun. 26, 2023, for corresponding European Application No. 23156329.7.

Ainash Zhumazhanova et al., "Ramen Study of Polycrystalline Si3N4 Irradiated with Swift Heavy Ions", Crystals, vol. 11, No. 11, Nov. 28, 2021 (Nov. 28, 2021), p. 1313, XP009544865.

Taiwanese Office Action dated Mar. 4, 2024, for corresponding Taiwanese Application No. 112100409.

First Chinese Office Action dated Aug. 19, 2025 for corresponding Chinese Application No. 202310014984.8.

European Communication pursuant to Article 94(3) EPC, dated Oct. 17, 2025 for corresponding European Application No. 23156329.7.

European Communication pursuant to Article 94(3) EPC dated May 28, 2025 for corresponding European Application No. 23 156 329.7.

* cited by examiner (S11) BRAZING (S12) FORMING CIRCUIT (S13) SILICON NITRIDE CIRCUIT SUBSTRATE

DIVISION

FIRST EVALUATION PROCESSING

| No. | | (A) Position (cm⁻¹) | (B) Amplitude | (C) Width (cm⁻¹) | (D) Area |
|---|---|---|---|---|---|
| 3X-1 | P1 | 862.808 | 6397.195 | 5.29 | 53157.03 |
| | P2 | 862.64 | 6354.66 | 5.137 | 51274.254 |
| | P3 | 862.681 | 6533.717 | 5.151 | 52870.363 |
| | P4 | 862.635 | 6003.822 | 5.349 | 50444.701 |
| | P5 | 862.706 | 7119.034 | 5.207 | 58230.472 |
| 3Y-1 | P1 | 862.609 | 5604.534 | 5.474 | 48189.619 |
| | P2 | 862.722 | 6533.316 | 5.426 | 55682.092 |
| | P3 | 862.661 | 6290.287 | 5.371 | 53071.717 |
| | P4 | 862.692 | 5980.15 | 5.27 | 49507.461 |
| | P5 | 862.683 | 5542.812 | 5.457 | 47510.064 |
| 3Y-2 | P1 | 862.795 | 6126.03 | 5.498 | 52905.672 |
| | P2 | 862.743 | 6552.891 | 5.371 | 55284.843 |
| | P3 | 862.7 | 5333.801 | 5.563 | 46609.471 |
| | P4 | 862.588 | 5829.354 | 5.418 | 49612.656 |
| | P5 | 862.72 | 5856.281 | 5.587 | 51398.174 |

SECOND EVALUATION PROCESSING

| No. | | (A) Position (cm⁻¹) | (B) Amplitude | (C) Width (cm⁻¹) | (D) Area |
|---|---|---|---|---|---|
| 3X-1 | P1 | 862.633 | 6564.085 | 5.134 | 52932.239 |
| | P2 | 862.519 | 6618.777 | 5.164 | 53692.046 |
| | P3 | 862.558 | 6027.432 | 5.219 | 49414.662 |
| | P4 | 862.528 | 5670.393 | 5.29 | 47115.585 |
| | P5 | 862.44 | 6535.75 | 5.208 | 53462.767 |
| 3Y-1 | P1 | 862.489 | 6077.251 | 5.406 | 51603.612 |
| | P2 | 862.442 | 6200.112 | 5.391 | 52499.874 |
| | P3 | 862.443 | 6094.018 | 5.427 | 51952.696 |
| | P4 | 862.398 | 6259.117 | 5.344 | 52545.943 |
| | P5 | 862.415 | 7687.956 | 5.321 | 64260.552 |
| 3Y-2 | P1 | 862.467 | 5730.563 | 5.473 | 49264.06 |
| | P2 | 862.392 | 5985.056 | 5.466 | 51384.022 |
| | P3 | 862.436 | 5739.451 | 5.426 | 48919.012 |
| | P4 | 862.533 | 5505.304 | 5.57 | 48170.977 |
| | P5 | 862.631 | 6581.359 | 5.498 | 56842.372 |

FIG. 9

| SAMPLE | SAMPLE CONDITION | MEASUREMENT POINT | LIGHTNESS L* | L* AVERAGE | CHROMATICITY a* | a* AVERAGE | CHROMATICITY b* | b* AVERAGE | COLOR SATURATION C* | C* AVERAGE | FULL WIDTH AT HALF MAXIMUM (FWHM) (cm⁻¹) | AVERAGE FULL WIDTH AT HALF MAXIMUM (FWHM) | STANDARD DEVIATION OF FULL WIDTH AT HALF MAXIMUM (FWHM) |
|---|---|---|---|---|---|---|---|---|---|---|---|---|---|
| 3X-1 | NO COLOR UNEVENNESS | P1 | 81.72 | | -0.76 | | 12.3 | | 12.32 | | 5.29 | | |
| | | P2 | 81.46 | | -0.66 | | 12.62 | | 12.64 | | 5.137 | | |
| | | P3 | 81.44 | | -0.68 | | 12.57 | | 12.59 | | 5.151 | | |
| | | P4 | 81.36 | | -0.62 | | 12.6 | | 12.62 | | 5.349 | | |
| | | P5 | 81.39 | 81.47 | -0.74 | -0.69 | 12.33 | 12.48 | 12.35 | 12.50 | 5.207 | 5.227 | 0.091 |
| 3Y-1 | COLOR UNEVENNESS (FRONT SURFACE) | P1 | 82.41 | | -0.56 | | 11.64 | | 11.65 | | 5.474 | | |
| | | P2 | 82.59 | | -0.55 | | 11.54 | | 11.55 | | 5.426 | | |
| | | P3 | 82.33 | | -0.31 | | 11.26 | | 11.26 | | 5.371 | | |
| | | P4 | 82.64 | | -0.55 | | 11.47 | | 11.48 | | 5.27 | | |
| | | P5 | 82.3 | 82.45 | -0.4 | -0.47 | 10.65 | 11.31 | 10.66 | 11.32 | 5.457 | 5.400 | 0.082 |
| 3Y-2 | COLOR UNEVENNESS (BACK SURFACE) | P1 | 82.37 | | -0.54 | | 11.67 | | 11.68 | | 5.498 | | |
| | | P2 | 82.52 | | -0.53 | | 11.54 | | 11.55 | | 5.371 | | |
| | | P3 | 82.27 | | -0.29 | | 11.26 | | 11.26 | | 5.563 | | |
| | | P4 | 82.52 | | -0.53 | | 11.52 | | 11.53 | | 5.418 | | |
| | | P5 | 82.27 | 82.39 | -0.43 | -0.46 | 10.73 | 11.34 | 10.74 | 11.35 | 5.587 | 5.487 | 0.092 |

FIG. 10

| SAMPLE | SAMPLE CONDITION | MEASUREMENT POINT | LIGHTNESS L* | L* AVERAGE | CHROMATICITY a* | a* AVERAGE | CHROMATICITY b* | b* AVERAGE | COLOR SATURATION C* | C* AVERAGE | FULL WIDTH AT HALF MAXIMUM (FWHM) (cm⁻¹) | AVERAGE FULL WIDTH AT HALF MAXIMUM (FWHM) | STANDARD DEVIATION OF FULL WIDTH AT HALF MAXIMUM (FWHM) |
|---|---|---|---|---|---|---|---|---|---|---|---|---|---|
| 3X-1 | NO COLOR UNEVENNESS | P1 | 81.72 | | -0.76 | | 12.3 | | 12.32 | | 5.134 | | |
| | | P2 | 81.46 | | -0.66 | | 12.62 | | 12.64 | | 5.164 | | |
| | | P3 | 81.44 | | -0.68 | | 12.57 | | 12.59 | | 5.219 | | |
| | | P4 | 81.36 | | -0.62 | | 12.6 | | 12.62 | | 5.29 | | |
| | | P5 | 81.39 | 81.47 | -0.74 | -0.69 | 12.33 | 12.48 | 12.35 | 12.50 | 5.208 | 5.203 | 0.059 |
| 3Y-1 | COLOR UNEVENNESS (FRONT SURFACE) | P1 | 82.41 | | -0.56 | | 11.64 | | 11.65 | | 5.406 | | |
| | | P2 | 82.59 | | -0.55 | | 11.54 | | 11.55 | | 5.391 | | |
| | | P3 | 82.33 | | -0.31 | | 11.26 | | 11.26 | | 5.427 | | |
| | | P4 | 82.64 | | -0.55 | | 11.47 | | 11.48 | | 5.344 | | |
| | | P5 | 82.3 | 82.45 | -0.4 | -0.47 | 10.65 | 11.31 | 10.66 | 11.32 | 5.321 | 5.378 | 0.044 |
| 3Y-2 | COLOR UNEVENNESS (BACK SURFACE) | P1 | 82.37 | | -0.54 | | 11.67 | | 11.68 | | 5.473 | | |
| | | P2 | 82.52 | | -0.53 | | 11.54 | | 11.55 | | 5.466 | | |
| | | P3 | 82.27 | | -0.29 | | 11.26 | | 11.26 | | 5.426 | | |
| | | P4 | 82.52 | | -0.53 | | 11.52 | | 11.53 | | 5.57 | | |
| | | P5 | 82.27 | 82.39 | -0.43 | -0.46 | 10.73 | 11.34 | 10.74 | 11.35 | 5.498 | 5.487 | 0.053 |

FIG. 11

| No. | | (A) Position (cm$^{-1}$) | (B) Amplitude | (C) Width (cm$^{-1}$) | (D) Area |
|---|---|---|---|---|---|
| 3A-1 | P1 | 862.583 | 5395.206 | 5.144 | 43596.749 |
| | P2 | 862.424 | 4469.605 | 5.193 | 36457.153 |
| | P3 | 862.53 | 5183.095 | 5.282 | 43005.591 |
| | P4 | 862.352 | 5737.683 | 5.439 | 49022.995 |
| | P5 | 862.488 | 4808.117 | 5.158 | 38959.267 |
| 3B-1 | P1 | 862.49 | 5023.846 | 5.24 | 41350.077 |
| | P2 | 862.463 | 5002.802 | 5.171 | 40637.593 |
| | P3 | 862.553 | 4550.544 | 5.13 | 36667.749 |
| | P4 | 862.397 | 5434.251 | 5.068 | 43259.607 |
| | P5 | 862.562 | 5351.321 | 5.243 | 44074.27 |

FIG. 16

| SAMPLE | SAMPLE CONDITION | MEASUREMENT POINT | LIGHTNESS L* | L* AVERAGE | CHROMATICITY a* | a* AVERAGE | CHROMATICITY b* | b* AVERAGE | CHROMATICITY C* | C* AVERAGE | FULL WIDTH AT HALF MAXIMUM (FWHM) (cm⁻¹) | AVERAGE FULL WIDTH AT HALF MAXIMUM (FWHM) | STANDARD DEVIATION OF FULL WIDTH AT HALF MAXIMUM (FWHM) |
|---|---|---|---|---|---|---|---|---|---|---|---|---|---|
| 3A-1 | NO COLOR UNEVENNESS | P1 | 78.96 | | -0.61 | | 11.85 | | 11.87 | | 5.144 | | |
| | | P2 | 78.60 | | -0.67 | | 11.34 | | 11.36 | | 5.193 | | |
| | | P3 | 78.67 | | -0.67 | | 11.61 | | 11.63 | | 5.282 | | |
| | | P4 | 78.70 | | -0.61 | | 11.69 | | 11.71 | | 5.439 | | |
| | | P5 | 78.78 | 78.74 | -0.62 | -0.64 | 11.78 | 11.65 | 11.80 | 11.67 | 5.158 | 5.243 | 0.122 |
| 3B-1 | NO COLOR UNEVENNESS | P1 | 78.84 | | -0.70 | | 11.79 | | 11.81 | | 5.240 | | |
| | | P2 | 78.47 | | -0.76 | | 11.35 | | 11.38 | | 5.171 | | |
| | | P3 | 78.33 | | -0.72 | | 11.57 | | 11.59 | | 5.130 | | |
| | | P4 | 78.58 | | -0.76 | | 11.50 | | 11.53 | | 5.068 | | |
| | | P5 | 78.46 | 78.54 | -0.73 | -0.73 | 11.75 | 11.59 | 11.77 | 11.62 | 5.243 | 5.170 | 0.075 |

FIG. 17

SILICON NITRIDE SUBSTRATE, SILICON NITRIDE CIRCUIT SUBSTRATE, AND EVALUATION METHOD, EVALUATION DEVICE, AND EVALUATION SYSTEM FOR SILICON NITRIDE SUBSTRATE AND SILICON NITRIDE CIRCUIT SUBSTRATE

CROSS-REFERENCE TO RELATED APPLICATIONS

This application claims the benefit of Japanese Patent Application No. 2022-028245 filed on Feb. 25, 2022 with the Japan Patent Office and Japanese Patent Application No. 2022-149016 filed on Sep. 20, 2022 with the Japan Patent Office, the entire disclosures of which are incorporated herein by reference.

BACKGROUND

The present disclosure relates to a silicon nitride substrate, a silicon nitride circuit substrate, and an evaluation method, an evaluation device, and an evaluation system for the silicon nitride substrate and the silicon nitride circuit substrate.

Japanese Unexamined Patent Application Publication No. 2003-267786 (Patent Document 1) discloses a technique to blacken the color of a sintered body compared to the color of a conventional material with reduced color unevenness and to provide a silicon nitride based ceramics sintered body having a substantial strength.

Japanese Unexamined Patent Application Publication No. 2005-214659 (Patent Document 2) discloses a technique related to a foreign substance detection device that is able to identify a foreign substance having low color contrast against the color of a circuit board.

Japanese Unexamined Patent Application Publication No. 2016-204206 (Patent Document 3), Japanese Unexamined Patent Application Publication No. 2016-204207 (Patent Document 4), Japanese Unexamined Patent Application Publication No. 2016-204209 (Patent Document 5), and Japanese Unexamined Patent Application Publication No. 2016-204210 (Patent Document 6) disclose a technique to provide a silicon nitride based ceramic member that is light in weight and high in hardness, excellent in resistance against processing such as polishing, and excellent in quality of external appearance.

Japanese Unexamined Patent Application Publication No. H09-227240 (Patent Document 7) discloses a technique to reduce the thickness of a surface color tone layer of a silicon nitride ceramics sintered body and to make the fracture strength characteristics of a surface layer and an inner layer uniform.

SUMMARY

Foreign substances and dirt adhered to a surface of a silicon nitride substrate cause insufficient contact between the silicon nitride substrate and a brazing material as well as poor insulation of the silicon nitride substrate itself. To detect such foreign substances and dirt adhered to the surface of the silicon nitride substrate, an appearance inspection is performed. A known method of the appearance inspection is a method of detecting foreign substances and dirt by taking an image of the surface of the silicon nitride substrate by using an imaging device such as a CCD camera and then comparing the data of thus taken image against a pre-registered reference data.

Color unevenness sometimes occurs on the surface of the silicon nitride substrate. Color unevenness is a phenomenon where, for example, the color is different between a central portion and an edge portion of the silicon nitride substrate. There is a risk that such color unevenness on the surface of the silicon nitride substrate may be erroneously detected as foreign substances or dirt as a result of the appearance inspection.

Furthermore, as warpage of the silicon nitride substrate increases, adhesion between the silicon nitride substrate and metallic circuit plate and metallic radiator plate, which are bonded to the silicon nitride substrate via a brazing material, decreases. Accordingly, there has been a problem that the metallic circuit substrate and the metallic radiator plate are easily detached from the silicon nitride substrate due to thermal stress that is generated during a temperature-lowering stage in a bonding process and during a heat cycle when a power module is activated.

In one aspect of the present disclosure, it is preferable to provide a silicon nitride substrate on which color unevenness is inhibited, an evaluation method, an evaluation device, and an evaluation system for the silicon nitride substrate.

In one aspect of the present disclosure, it is preferable to provide a silicon nitride substrate which has reduced warpage and on which color unevenness is inhibited, a silicon nitride circuit substrate, and an evaluation method, an evaluation device, and an evaluation system for the silicon nitride substrate and the silicon nitride circuit substrate.

MEANS FOR SOLVING THE PROBLEMS (1) One aspect of the present disclosure is a silicon nitride substrate including a first surface and a second surface disposed opposite the first surface. One of the first surface or the second surface is a measurement surface. On the measurement surface, a value of an average full width at half maximum (FWHM) $C_{ave}$ is broader than 0 cm$^{-1}$ and narrower than 5.32 cm$^{-1}$ as measured by using a measurement method below.

The measurement method of the average full width at half maximum (FWHM) $C_{ave}$: one central portion and four edge portions on the measurement surface are determined as measurement points; a Raman spectrum is measured at each of the measurement points; a full width at half maximum (FWHM) C of a spectral peak having the maximum intensity within a range from 850 cm$^{-1}$ or greater to 875 cm$^{-1}$ or less is calculated in each Raman spectrum; and an average value of full width at half maximum (FWHM)s C thus calculated is the average full width at half maximum (FWHM) $C_{ave}$.

On a silicon nitride substrate in one aspect of the present disclosure, color unevenness is inhibited. In addition, on a silicon nitride substrate in one aspect of the present disclosure, warpage is reduced and color unevenness is inhibited.

(2) Another aspect of the present disclosure is an evaluation method for the silicon nitride substrate for evaluating color unevenness of the silicon nitride substrate. The method comprises measuring a Raman spectrum at a measurement point on the silicon nitride substrate; measuring a full width at half maximum (FWHM) of a spectral peak included in the Raman spectrum and assigned to a lattice vibration of a silicon nitride; and evaluating color unevenness of the silicon nitride substrate based on the full width at half maximum (FWHM).

The evaluation method for silicon nitride substrate of another aspect of the present disclosure can evaluate color unevenness even when the area of the measurement point is small. The method is able to evaluate color unevenness as well as warpage.

(3) Another aspect of the present disclosure is an evaluation device for evaluating color unevenness of a silicon nitride substrate. The device comprises a data obtaining unit configured to obtain a Raman spectrum measured at a measurement point on the silicon nitride substrate; and a full width at half maximum (FWHM) measurement unit configured to measure a full width at half maximum (FWHM) of a spectral peak which is included in the Raman spectrum obtained by the data obtaining unit and is assigned to a lattice vibration of a silicon nitride.

The evaluation device of another aspect of the present disclosure can evaluate color unevenness even when the area of the measurement point is small. The device is able to evaluate color unevenness as well as warpage.

(4) Another aspect of the present disclosure is an evaluation system for evaluating color unevenness of a silicon nitride substrate. The system comprises a Raman measuring device configured to measure a Raman spectrum at a measurement point on the silicon nitride substrate; and the evaluation device described in the above (3).

(5) Another aspect of the present disclosure is a silicon nitride circuit substrate comprising the aforementioned silicon nitride substrate, a metallic circuit disposed on a first surface of the silicon nitride substrate, and a metallic radiator plate disposed on a second surface of the silicon nitride substrate, the second surface is situated opposite the first surface. This silicon nitride circuit substrate renders the same effects as those mentioned for the silicon nitride substrate.

BRIEF DESCRIPTION OF THE DRAWINGS

An example embodiment of the present disclosure will be described hereinafter with reference to the accompanying drawings, in which:

FIG. 9 is a table showing wave values, amplitudes, full width at half maximum (FWHM)s, and areas of spectral peaks of silicon nitride substrates 3X, 3Y.

FIG. 10 is a table showing lightness L*, chromaticity a* from green to red, chromaticity b* from yellow to blue, color saturation C*, and full width at half maximum (FWHM) at each measurement point in the first evaluation process of the silicon nitride substrates 3X, 3Y;

FIG. 11 is a table showing lightness L*, chromaticity a* from green to red, chromaticity b* from yellow to blue, color saturation C*, and full width at half maximum (FWHM) at each measurement point in the second evaluation process of the silicon nitride substrates 3X, 3Y;

FIG. 16 is a table showing wave values, amplitudes, full width at half maximum (FWHM)s, and areas of spectral peaks of silicon nitride substrates 3A, 3B;

FIG. 17 is a table showing lightness L*, chromaticity a* from green to red, chromaticity b* from yellow to blue, color saturation C*, and full width at half maximum (FWHM) at each measurement point in the evaluation process of the silicon nitride substrates 3A, 3B.

DETAILED DESCRIPTION OF EXEMPLARY EMBODIMENTS

1. Configuration of Power Module 1 and Silicon Nitride Circuit Substrate 2

Figure 1:
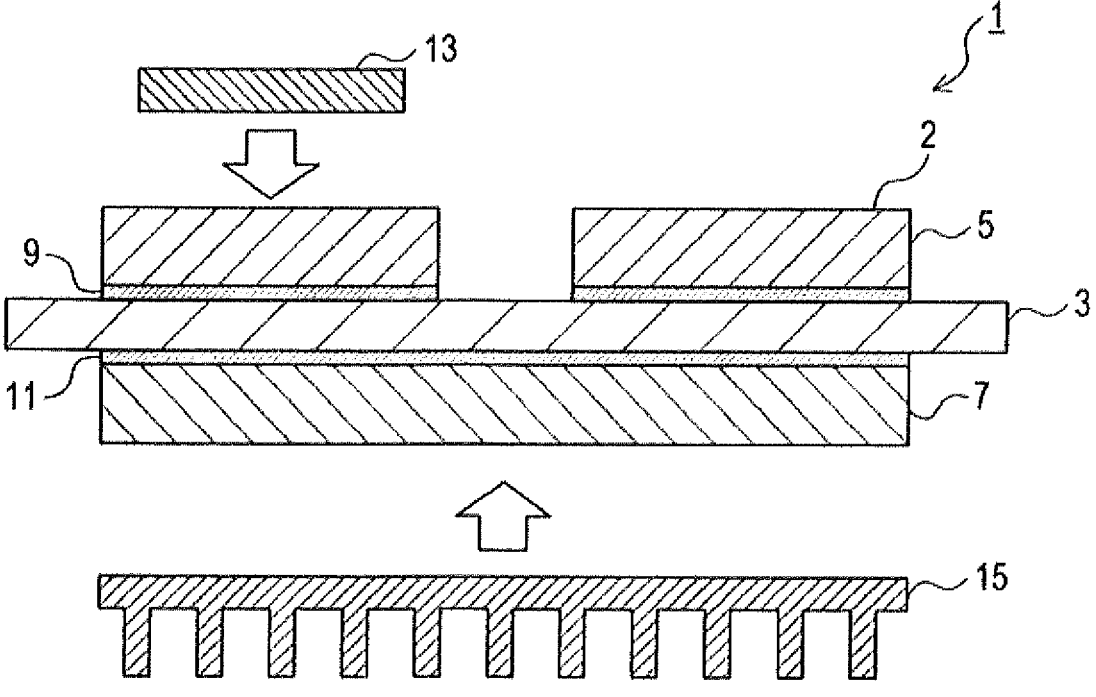
FIG. 1 is a side view showing a configuration of a power module and a silicon nitride circuit substrate.

Configurations of a power module 1 and a silicon nitride circuit substrate 2 will be explained with reference to FIG. 1. The silicon nitride circuit substrate 2 comprises a silicon nitride substrate 3, a metallic circuit 5, a metallic radiator plate 7, and brazing material layers 9, 11. The power module 1 comprises the silicon nitride circuit substrate 2, a semiconductor chip 13, and a heat sink 15.

The silicon nitride substrate 3 comprises, for example, a first surface and a second surface. The first surface is a top surface in a molded body manufacturing process S2 and a sintering process S3 which will be described later. The second surface is a surface disposed opposite the first surface. A shape of a plane of the silicon nitride substrate 3 is rectangular for example. The shape of the plane is a shape of the silicon nitride substrate 3 when viewed along the thickness of the silicon nitride substrate 3. For example, the length of each sides of the silicon nitride substrate 3 is 100 mm or longer.

The metallic circuit 5 is formed of a copper plate. The metallic circuit 5 is attached to the first surface of the silicon nitride substrate 3 via a brazing material layer 9. The metallic radiator plate 7 is formed of a copper plate. The metallic radiator plate 7 is attached to the second surface of the silicon nitride substrate 3 via a brazing material layer 11. The semiconductor chip 13 is attached to the metallic circuit 5. The heat sink 15 is attached to the metallic radiator plate 7.

2. Manufacturing Method of Silicon Nitride Substrate 3

Figure 2:
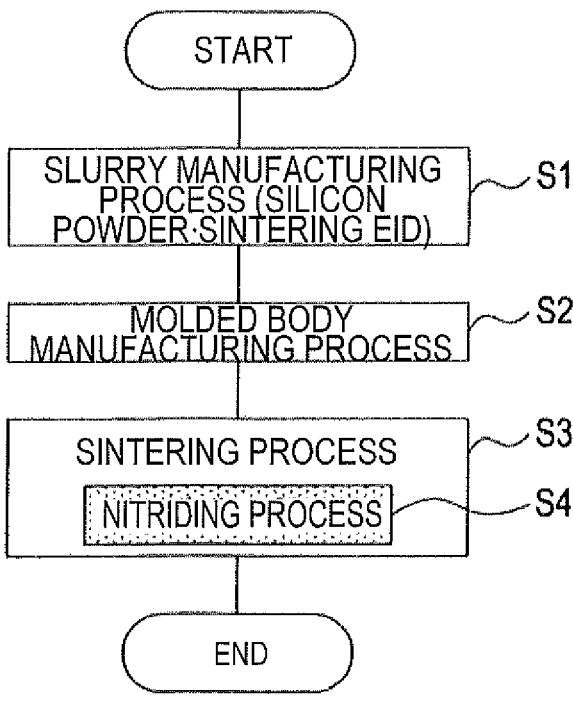
FIG. 2 is an explanatory drawing showing a manufacturing method of a silicon nitride substrate.

The silicon nitride substrate 3 can be manufactured, for example, by a method shown in FIG. 2. The manufacturing method comprises a slurry manufacturing process S1, the molded body manufacturing process S2, the sintering process S3, and a nitriding process S4.

(2-1) Slurry Manufacturing Process S1

Base powder is obtained, for example, by adding a sintering aid to silicon powder. Examples of the sintering aid may include an rare earth element oxide and a magnesium compound. A slurry is manufactured by using the base powder.

Examples of the silicon powder may include silicon powder of industrially available grades. A median diameter D50 of the silicon powder before pulverization is preferably 6 μm or greater, and more preferably, 7 μm or greater.

The BET specific surface area of the silicon powder before pulverization is preferably 3 m$^2$/g or less, and more preferably, 2.5 m$^2$/g or less. The amount of oxygen in the silicon powder before pulverization is preferably 1.0% by mass or less, and more preferably, 0.5% by mass or less. The amount of impurity carbon in the silicon powder before pulverization is preferably 0.15% by mass or less, and more preferably, 0.10% by mass or less.

The purity of the silicon powder is preferably 99% or higher, and more preferably, 99.5% or higher. Impurity oxygen included in the silicon powder is one of the factors inhibiting heat conduction of the silicon nitride substrate that can be obtained by reaction sintering. The thermal conductivity of the silicon nitride substrate improves as the purity of the silicon powder increases.

It is preferable to prepare the base powder such that the total amount of impurity oxygen contained in the silicon powder and oxygen obtained from the magnesium compound is in the range from 0.1% by mass or greater to 1.1% by mass or less with respect to the amount of silicon converted into a silicon nitride by limiting the amount of oxygen obtained from the magnesium compound.

In the silicon nitride substrate obtained by reaction sintering, impurity carbon contained in the silicon powder inhibits the growth of silicon nitride particles. Inhibition of the growth of the silicon nitride particles makes it difficult to densify the silicon nitride substrate. When it is difficult to densify the silicon nitride substrate, thermal conductivity and insulation characteristic of the silicon nitride substrate decreases. Accordingly, it is preferable that impurity carbon contained in the silicon powder is reduced as much as possible.

In the present disclosure, the BET specific surface area (m$^2$/g) is a value calculated by the BET one point method (JIS R 1626:1996 "Measuring method for the specific surface area of fine ceramic powder by gas adsorption using the BET method") using a BET specific surface area measuring device. The median diameter D50 (μm) is the grain diameter when the cumulative frequency is 50% in the particle size distribution calculated by the laser diffraction/scattering method.

Although it is not essential in the manufacturing method of the invention of the present disclosure, the base powder may include silicon nitride powder. However, since the cost increases when a silicon nitride is used compared to when silicon is used, it is preferable to reduce the amount of the silicon nitride as much as possible. The amount of the silicon nitride is preferably 50 mol % or less, more preferably 10 mol % or less, and yet more preferably 5 mol % or less of silicon (converted into silicon nitride). In this case, the silicon nitride substrate is manufactured by nitriding a sheet-shaped molded body that contains silicon such that the silicon nitride is 50 mol % or less of silicon converted into the silicon nitride.

Examples of the rare earth element oxides may include oxides of yttrium (Y), ytterbium (Yb), gadolinium (Gd), erbium (Er), and lutetium (Lu). These rare earth element oxides can be easily obtained and are stable as oxides. Specific examples of the rare earth element oxides may include yttrium oxide (Y$_2$O$_3$), ytterbium oxide (Yb$_2$O$_3$), gadolinium oxide (Gd$_2$O$_3$), erbium oxide (Er$_2$O$_3$), and lutetium oxide (Lu$_2$O$_3$).

In the silicon nitride substrate, the number of moles of the rare earth element oxide converted into a trivalent oxide (RE$_2$O$_3$: RE stands for rare earth element) is M1. In the silicon nitride substrate, the number of moles of silicon converted into a silicon nitride (Si$_3$N$_4$) is M2. M2 is the number of moles of a silicon nitride obtained when silicon is completely nitrided. In the silicon nitride substrate, the number of moles of the magnesium compound converted into MgO is M3.

The molar ratio of M1 to the total number of moles in M1, M2, and M3 (hereinafter referred to as the molar ratio of rare earth oxides) is, for example, 0.5 mol % or greater and less than 2 mol %. When the molar ratio of rare earth oxides is 0.5 mol % or greater, the effect of the sintering aid increases to sufficiently increase the density of the silicon nitride substrate. When the molar ratio of rare earth oxides is less than 2.0 mol %, grain boundary phases having a low thermal conductivity does not easily increase, the thermal conductivity of the sintered body increases, and the amount of use of expensive rare earth element oxides decreases. In particular, the molar ratio of rare earth oxides is preferably 0.6 mol % or greater and less than 2 mol %, and more preferably 1 mol % or greater and 1.8 mol % or less.

One, or two or more types of magnesium compound containing "Si", "N", or "O" may be used as the magnesium compound. Preferable magnesium compounds are, for example, magnesium oxide (MgO), silicon nitride magnesium (MgSiN$_2$), magnesium silicide (Mg$_2$Si), and magnesium nitride (Mg$_3$N$_2$).

The ratio of the mass of the silicon nitride magnesium to the total mass of the magnesium compound (hereinafter referred to as the mass ratio of silicon nitride magnesium) is preferably 87% by mass or greater. When the mass ratio of silicon nitride magnesium is 87% by mass or greater, the oxygen concentration in the obtained silicon nitride substrate may be decreased. When the mass ratio of silicon nitride magnesium is less than 87% by mass, the amount of oxygen in the sintered silicon nitride particle increases; therefore, the thermal conductivity of the sintered silicon nitride substrate decreases. Accordingly, in order to improve the thermal conductivity of the silicon nitride substrate, it is preferable that the mass ratio of silicon nitride magnesium is high. It is more preferable that the mass ratio of the silicon nitride magnesium is 90% by mass or greater.

The molar ratio of M3 to the total number of moles in M1, M2, and M3 (hereinafter referred to as the molar ratio of magnesium compound) is, for example, 8 mol % or greater and less than 15 mol %. When the molar ratio of magnesium compound is 8 mol % or greater, the effect of the sintering aid increases to sufficiently increase the density of the silicon nitride substrate. When the molar ratio of the magnesium compound is less than 15 mol %, grain boundary phases having a low thermal conductivity does not easily increase, and the thermal conductivity of the sintered body increases. In particular, the molar ratio of the magnesium compound is preferably 8 mol % or greater and less than 14 mol %, and more preferably 9 mol % or greater and 11 mol % or less.

Methods of manufacturing a slurry includes the following method for example. The rare earth element oxide and the magnesium compound is added to the silicon powder such that a given ratio is achieved. Then, a dispersion medium is added. The dispersion medium is, for example, an organic solvent. A dispersing agent is also added as necessary.

The slurry, which is a product of dispersion of the base powder, is manufactured by pulverizing the base powder in a ball mill. The dispersion medium is, for example, an organic solvent. Examples of the dispersion medium may include ethanol, n-butanol, and toluene. Examples of the dispersing agent may include a sorbitan ester type dispersing agent, and a polyoxyalkylene type dispersing agent.

The addition amount of the dispersion medium is preferably 40% by mass or greater and 70% by mass or less with respect to the total amount of the base powder, for example. The addition amount of the dispersing agent is preferably 0.3% by mass or greater and 2% by mass or less with respect to the total amount of the base powder, for example. After dispersion, the dispersion medium may be removed or replaced with another dispersion medium as necessary.

(2-2) Molded Body Manufacturing Process S2

For example, a dispersion medium, an organic binder, and a dispersing agent are added to the slurry obtained as described above. Then, the slurry undergoes vacuum defoaming as necessary. Then, the viscosity of the slurry is adjusted to be within a given range. As a result, a coating slurry can be obtained.

Then, thus obtained coating slurry is molded into a sheet using a sheet molding machine. Then, the sheet-shaped coating slurry is cut into a given size and dried. As a result, a sheet-shaped molded body can be obtained.

The organic binder used in manufacturing the coating slurry is not particularly limited. Examples of the organic binder used in manufacturing the coating slurry may include a PVB-based resin, an ethyl cellulose-based resin, and an acrylic resin. Examples of the PVB-based resin may include a polyvinyl butyral resin. The addition amount of the dispersion medium, the organic binder, and the dispersing agent may be appropriately adjusted depending on coating conditions.

A method of molding the coating slurry into a sheet is not particularly limited. Examples of the method of molding the coating slurry into a sheet may include the doctor blade method, and the extrusion molding method.

The sheet-shaped molded body manufactured in the molded body manufacturing process S2 has a thickness of 0.15 mm or greater and 0.8 mm or less for example. The manufactured sheet-shaped molded body is cut into a given size as necessary by using a punching machine, for example.

(2-3) Sintering Process S3 and Nitriding Process S4

A sintering process S3 includes a degreasing process for removing the organic binder included in the molded body, a nitriding process S4 for producing a silicon nitride by a reaction between silica and nitrogen contained in the molded body, and a densification sintering process that is performed after the nitriding process S4.

The degreasing process, the nitriding process S4, and the densification sintering process may be performed in series in different furnaces, or may be performed continuously in a single furnace. 1600 or more of the molded bodies undergo a heat treatment at the same time in a single furnace. These molded bodies that underwent the heat treatment in the single furnace are in the same lot.

Figure 3:
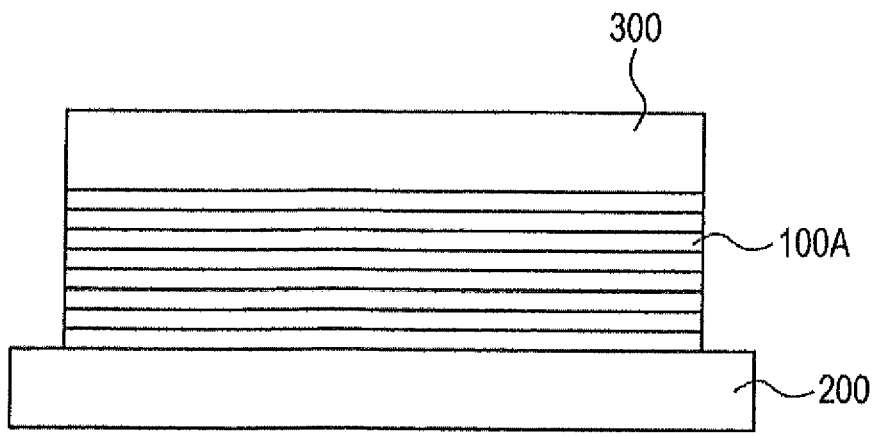
FIG. 3 is an explanatory diagram showing a state where molded bodies are arranged in layers.

In the sintering process S3, for example, as shown in FIG. 3, molded bodies 100A are layered on a setter 200. The setter 200 is formed from boron nitride (BN). An unillustrated separator is disposed between one molded body 100A and another molded body 100A. A weight 300 is placed on the molded bodies 100A.

Thus prepared molded bodies 100A are placed inside an electric furnace. Then, the degreasing process is performed. After the degreasing process, a decarbonization process is performed at the temperature from 900° C. to 1300° C. using a nitriding apparatus. Then, the nitriding process S4 is performed. In the nitriding process S4, the temperature is increased to a given temperature in the nitrogen atmosphere. The temperature control in the nitriding process S4 will be explained later.

The densification sintering process is performed next in a sintering apparatus. The densification sintering process is performed while applying a load of 10 Pa or greater and 1000 Pa or less on the molded bodies 100A by the weight 300.

Examples of the aforementioned separator may include a boron nitride (BN) powder layer having a thickness of about 3 μm or greater and 20 μm or less. The boron nitride powder layer has a function to facilitate separation of the silicon nitride substrate that is formed into the sintered body after the densification sintering process. The boron nitride powder layer is formed by, for example, applying boron nitride powder in slurry form to one side of each molded body 100A. Examples of a method of applying boron nitride powder in slurry form include spraying, brush application, and screen printing. The boron nitride powder preferably has, for example, the purity of 95% or higher and the median diameter D50 of 1 μm or greater and 20 μm or less.

The manufacturing of the silicon nitride substrate is completed by the aforementioned processes. The aforementioned manufacturing method enables manufacturing of the silicon nitride substrate having thermal conductivity of 110 W/(m·K) or greater by using silicon powder having high purity. The silicon nitride substrate in the present embodiment is produced by nitriding silicon contained in the sheet-shaped molded body. The thickness of the silicon nitride substrate is, for example, 0.15 mm or greater and 0.8 mm or less.

(2-4) Relationship Between Color Unevenness and Temperature Control in Nitriding Process S4

In the aforementioned method of manufacturing the silicon nitride substrate, silicon powder is used instead of silicon nitride powder; therefore, the nitriding process S4 is necessary. The inventor newly found that, depending on the heating conditions in the nitriding process S4, color unevenness may occur on a surface of the manufactured silicon nitride substrate.

In the present disclosure, "a/the surface of the silicon nitride substrate" may be the first surface or the second surface of the silicon nitride substrate. The second surface is a surface situated opposite the first surface.

Figure 4:
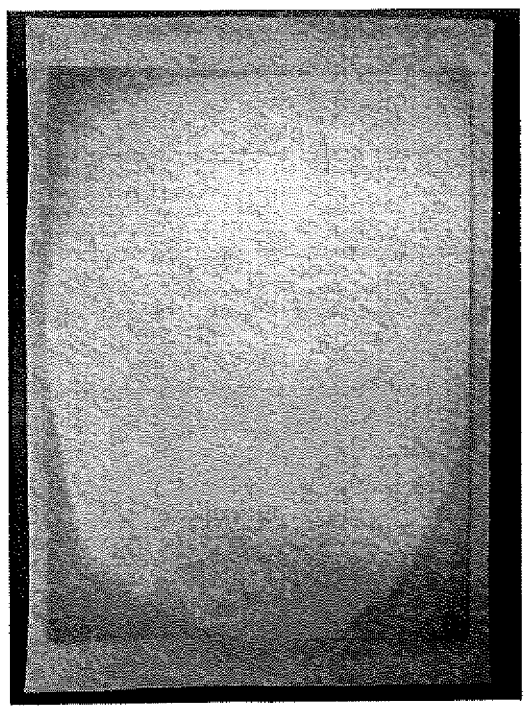
FIG. 4 is a photographic image showing a surface of a silicon nitride substrate, which is included in the same lot as a silicon nitride substrate 3Y and on which color unevenness has occurred, immediately after a nitriding process.

In the present disclosure, "color unevenness" means, for example, that the color of the central portion and the color of the edge portions of a rectangular silicon nitride substrate are different. FIG. 4 is a photographic image of a surface of the silicon nitride substrate, which is included in the same lot as the silicon nitride substrate 3Y and on which color unevenness has occurred, immediately after a nitriding process. In FIG. 4, the central portion of the silicon nitride substrate is tinged with white while the edge portions of the silicon nitride substrate are tinged with black. In other words, the color of the central portion and the color of the edge portions are different.

The inventor has keenly examined the mechanism for the occurrence of color unevenness on the surface of the silicon nitride substrate. It is assumed that color unevenness occurs by the mechanism given below.

The nitriding process S4 is a heating treatment, in which the sheet-shaped layered molded bodies 100A is placed on the setter 200 and the weight 300 is placed on the layered molded bodies 100A, in the nitrogen atmosphere as shown in FIG. 3 for example. Among the layered molded bodies 100A, those molded bodies 100A interposed between the uppermost molded body 100A and the lowermost molded body 100A are defined as specific molded bodies.

The central portion of the specific molded bodies tends to hold heat. Therefore, the temperature of the central portion of the specific molded bodies is high while the temperature of the edge portions of the specific molded bodies is low. Accordingly, the nitriding reaction is facilitated in the central portion of the specific molded bodies while the nitriding reaction is slow in the edge portions of the specific molded bodies. Since the nitriding reaction is an exothermal reaction, temperature surges at the central portion, where the nitriding reaction is facilitated, as a result of the heating value leading to positive feedback. When the temperature increase at the central portion is large, a phenomenon (hereinafter referred to as thermal runaway) occurs in which the temperature at the central portion exceeds the melting point of silica which causes the silica to melt. In addition, since the temperature difference between the central portion and the edge portions becomes large, lack of silica occurs at the edge portions. If the sintering process is performed when silica is lacking at the edge portions, it ultimately leaves silica that could not be nitrided in the edge portions. It is assumed that color unevenness occurs accordingly.

According to the aforementioned mechanism, it is assumed that color unevenness that occurs on the surface of the silicon nitride substrate is caused due to a temperature-increase process in the nitriding process S4. If it is possible to perform the temperature-increase process while achieving a temperature distribution that allows less temperature difference between the central portion and the edge portions, the thermal runaway can be inhibited and the color unevenness can be reduced.

Therefore, the temperature-increase process in the nitriding process S4 is preferably a process to increase the temperature gradually while minimizing the temperature difference between the central portion and the edge portion.

In the temperature-increase process in the nitriding process S4, temperature is increased until it reaches the highest heating temperature. The highest heating temperature is preferably 1390° C. or higher and 1500° C. or lower. In the temperature-increase process in the nitriding process S4, temperature increases in a stepwise manner for example. In a range from 1270° C. to 1340° C. in the temperature-increase process, the average of the amount of temperature increase per unit hour (hereinafter referred to as an inclination of the heating temperature) is preferably 3.1° C./h or less. If the average of the inclination of the heating temperature is 3.1° C./h or less, color unevenness can be reduced.

To reduce the warpage of the silicon nitride substrate, it is preferable to control the cooling conditions in each of the nitriding process and the densification sintering process as follows. In the nitriding process, the cooling speed in a temperature-decrease range from the highest heating temperature to 1100° C. is preferably 262.2° C./h or less. In the densification sintering process, the cooling speed in a temperature-decrease range from the highest heating temperature to 800° C. is preferably 280.7° C./h or less. These controls enable reduction of the amount of warpage of the silicon nitride substrate within a range from 0.1 mm to 1 mm. The amount of warpage is a value obtained by measuring a warpage in accordance with a standard called SORI. Specifically, the least square plane of the top surface of a sample is first calculated (defined), and the total of the absolute value of the distance from the calculated least square plane to the highest point on the top surface of the sample and the absolute value of the distance from the calculated least square plane to the lowest point on the top surface of the sample is obtained as the amount of warpage.

3. Manufacturing Method of Power Module 1 and Silicon Nitride Circuit Substrate 2

Figure 5:
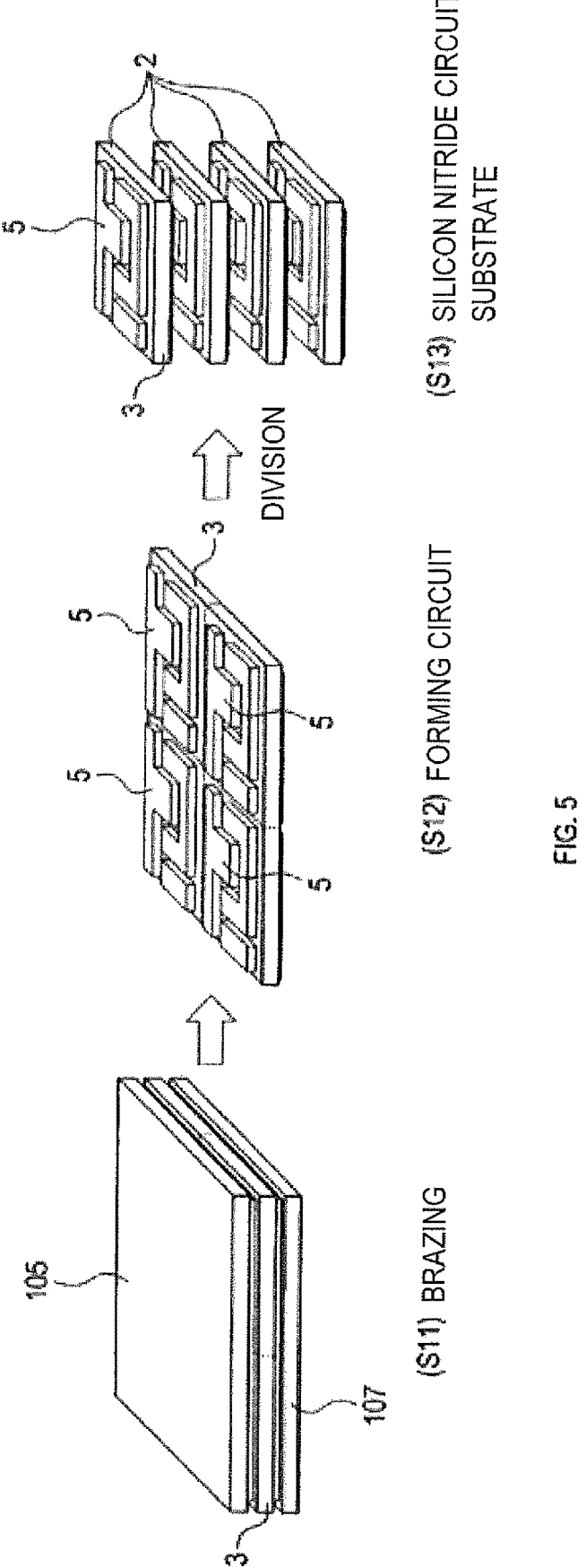
FIG. 5 is an explanatory drawing showing a manufacturing method of the silicon nitride circuit substrate.

With reference to FIG. 5, a manufacturing method of the power module 1 and the silicon nitride circuit substrate 2 will be explained. In S11, a metallic plate 105 and a metallic radiator plate 107 are attached to the silicon nitride substrate 3 by brazing. In the subsequent S12, a part of the metallic plate 105 is removed to form the metallic circuit 5. In the subsequent S13, the silicon nitride substrate 3 is divided to obtain at least two silicon nitride circuit substrates 2. In addition, the semiconductor chip 13 and the heat sink 15 are attached to each silicon nitride circuit substrate 2. Since the silicon nitride substrate 3 included in the silicon nitride circuit substrate 2 is manufactured in accordance with the aforementioned "2. Manufacturing Method of Silicon Nitride Substrate 3", color unevenness is inhibited and the thermal conductivity is high in the silicon nitride substrate 3.

4. Configuration of Evaluation System 201

Figure 6:
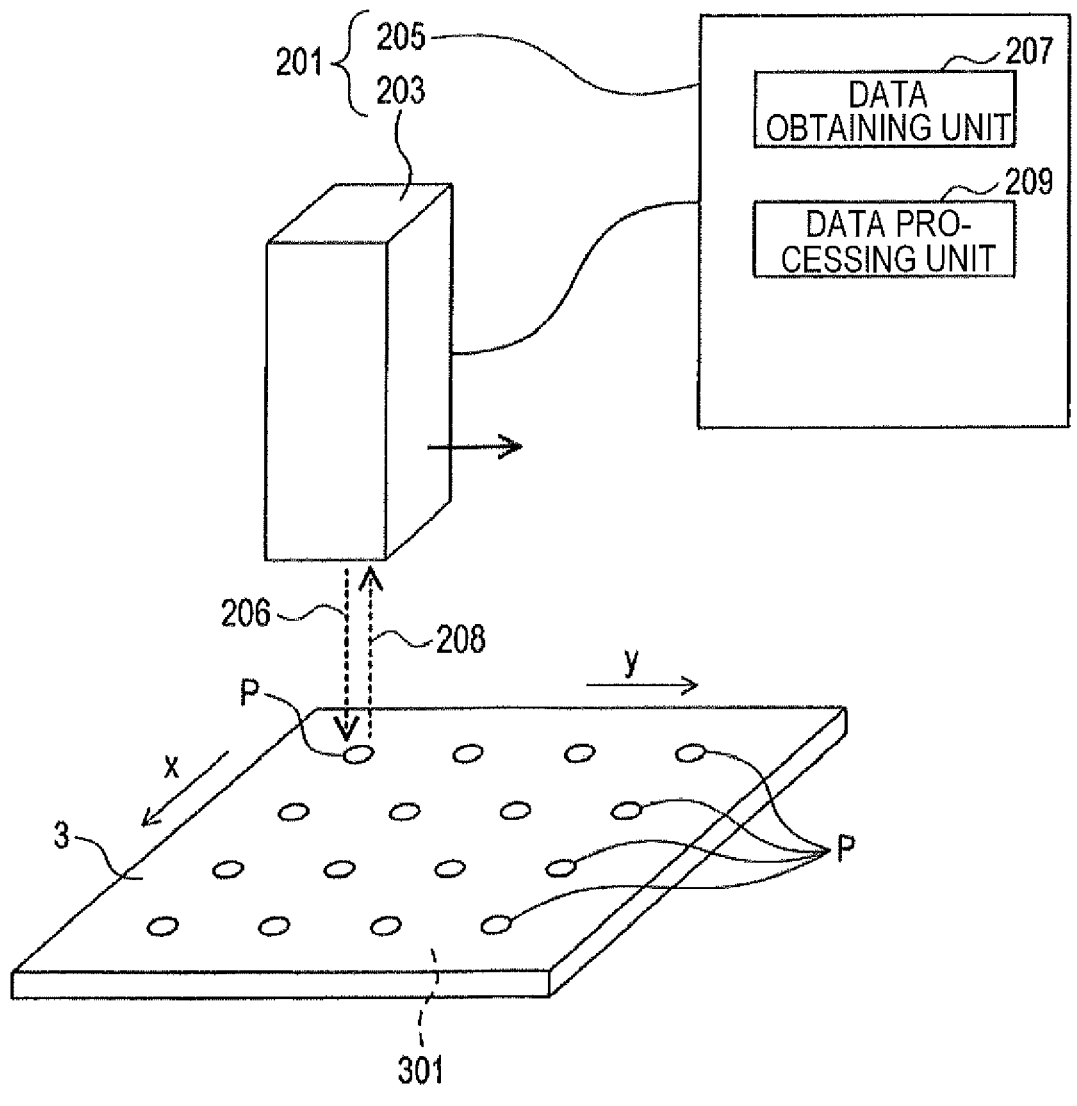
FIG. 6 is an explanatory drawing showing a configuration of an evaluation system for the silicon nitride substrate.

The configuration of an evaluation system 201 will be explained with reference to FIG. 6. The evaluation system 201 is used to evaluate the silicon nitride substrate 3. The evaluation system 201 comprises a Raman measuring device 203 and an evaluation device 205.

The Raman measuring device 203 irradiates a measurement point P, which is a part of a measurement surface 301, with a laser beam 206 and detects Raman scattered light 208 generated at the measurement point P. Accordingly, the Raman measuring device 203 can measure the Raman spectrum of the measurement point P. The irradiation diameter of the laser beam 206 is about 1 μm. The irradiation diameter is a diameter of a spot of irradiation. Therefore, the Raman measuring device 203 can measure the Raman spectrum of a narrow area.

The Raman measuring device 203 can move the location of irradiation of the laser beam 206 independently along an X axis and a Y axis. The X axis and the Y axis are both parallel to the measurement surface 301. The X axis is perpendicular to the Y axis. Therefore, the Raman measuring device 203 can measure the Raman spectra of at least two measurement point P on the measurement surface 301.

The evaluation device 205 comprises a microcomputer comprising a CPU, and a semiconductor memory such as a RAM or ROM. Functions of the evaluation device 205 are realized by the CPU executing a program stored in a non-transitory tangible storage medium. A method corresponding to the program is also executed by the execution of the program.

The evaluation device 205 comprises a data obtaining unit 207 and a data processing unit 209. The data obtaining unit 207 obtains the Raman spectrum from the Raman measuring device 203. The data processing unit 209 performs a process to evaluate color unevenness of the silicon nitride substrate 3 based on the Raman spectrum obtained by the data obtaining unit 207. This process will be explained later. The data processing unit 209 corresponds to a full width at half maximum (FWHM) measurement unit.

5. Evaluation Method for Silicon Nitride Substrate

Color unevenness of the silicon nitride substrate 3 can be evaluated by the following method. For example, the evaluation system 201 can be used to evaluate color unevenness.

The silicon nitride substrate 3 to be evaluated is prepared first. The silicon nitride substrate 3 comprises, for example, a first surface and a second surface. The second surface is a surface situated opposite the first surface. The shape of a plane of the silicon nitride substrate 3 is, for example, rectangular. For example, the length of each side of the silicon nitride substrate 3 is 100 mm or greater.

Then, one of the first surface or the second surface is defined as the measurement surface 301. Then, the measurement point P is defined on the measurement surface 301.

Figure 7:
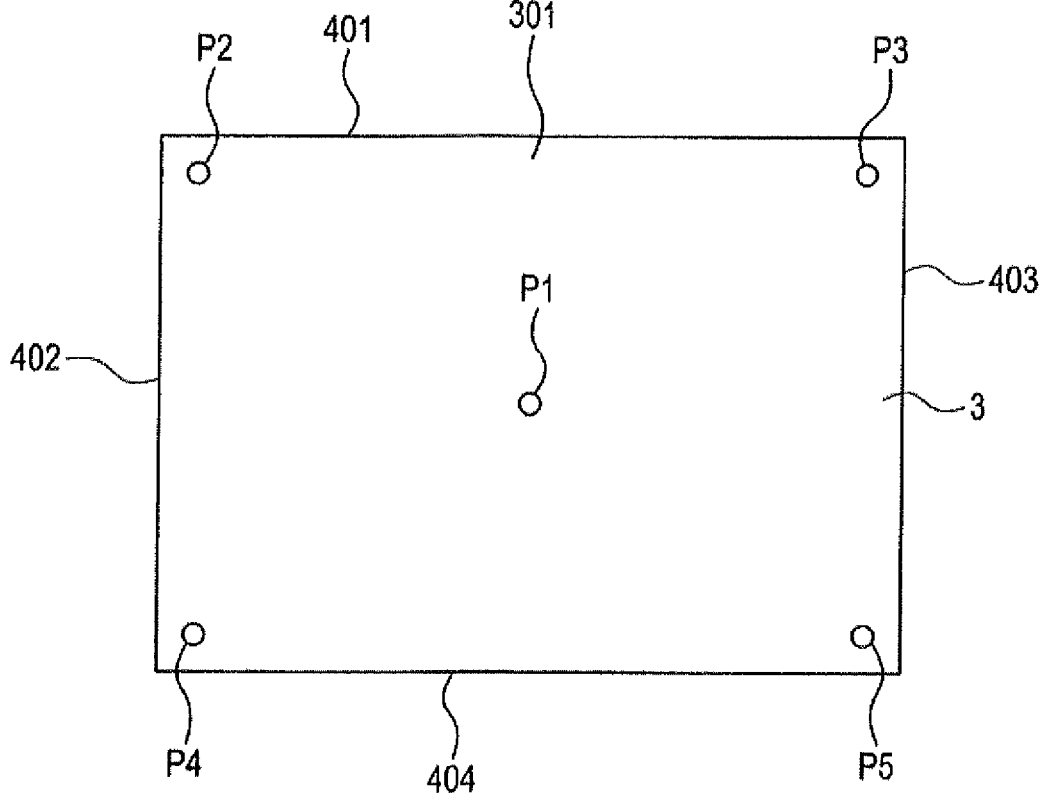
FIG. 7 is an explanatory drawing showing an arrangement of measurement points on a measurement surface.

There may be one measurement point P or two or more measurement points P. For example, as shown in FIG. 7, there may be five measurement points P1 to P5. The measurement point P1 is situated at the central portion of the measurement surface 301. The measurement points P2 to P5 are each situated at the edge portion of the measurement surface 301. The measurement point P2 to P5 are each situated at one of the four corners of the measurement surface 301. The distance from the measurement point P2 to a long side 401 is 10 mm. The distance from the measurement point P2 to a short side 402 is 15 mm. The distance from the measurement point P3 to the long side 401 is 10 mm. The distance from the measurement point P3 to a short side 403 is 15 mm. The distance from the measurement point P4 to long side 404 is 10 mm. The distance from the measurement point P4 to the short side 402 is 15 mm. The distance from the measurement point P5 to the long side 404 is 10 mm. The distance from the measurement point P5 to the short side 403 is 15 mm.

Then, the Raman spectrum is measured at the measurement point P by using the Raman measuring device 203. If there are two or more measurement points P, the Raman spectrum is measured at each of those measurement points P.

Then, the data obtaining unit 207 obtains the Raman spectrum measured at the measurement point P from the Raman measuring device 203. If the Raman measuring device 203 measured the Raman spectra at two or more measurement points P, the data obtaining unit 207 obtains the Raman spectrum of each of the measurements point P.

Then, the data processing unit 209 measures a full width at half maximum (FWHM) of a spectral peak included in the Raman spectrum obtained by the data obtaining unit 207 and assigned to a lattice vibration of the silicon nitride. If the Raman measuring device 203 measured the Raman spectra at two or more measurement points P, the data processing unit 209 measures the full width at half maximum (FWHM) of a spectral peak in each of the Raman spectra measured at those measurement points P.

For example, if the Raman spectrum is measured at each of the measurement points P1 to P5, the data processing unit 209 measures a full width at half maximum (FWHM) C1 of a spectral peak included in the Raman spectrum measured at the measurement point P1; a full width at half maximum (FWHM) C2 of a spectral peak included in the Raman spectrum measured at the measurement point P2; a full width at half maximum (FWHM) C3 of a spectral peak included in the Raman spectrum measured at the measurement point P3; a full width at half maximum (FWHM) C4 of a spectral peak included in the Raman spectrum measured at the measurement point P4; and a full width at half maximum (FWHM) C5 of a spectral peak included in the Raman spectrum measured at the measurement point P5.

Figure 8:
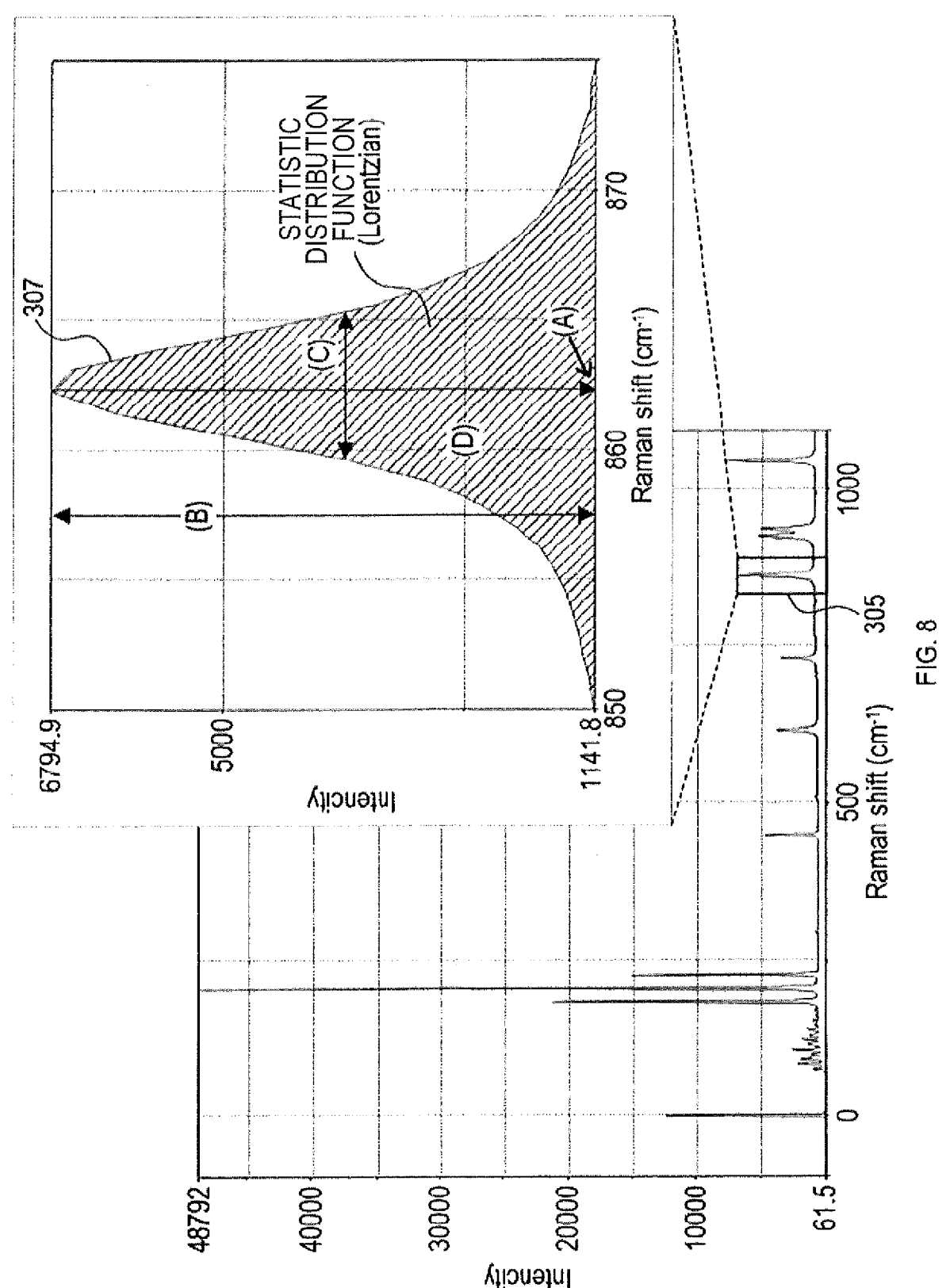
FIG. 8 is an explanatory drawing showing a full width at half maximum (FWHM) of a spectral peak after fitting.

As shown in FIG. 8, spectral peak 305 assigned to a lattice vibration of the silicon nitride is a peak having its maximum intensity in a range from 850 $cm^{-1}$ or greater to 875 $cm^{-1}$ or less for example.

The method by which the data processing unit 209 measures the full width at half maximum (FWHM) is given below for example. As shown in FIG. 8, the data processing unit 209 performs fitting on the spectral peak 305 using a statistic distribution function and obtains spectral peak 307 after fitting. Examples of the statistic distribution function may include the Lorentzian function. The data processing unit 209 measures the full width at half maximum (FWHM) C at the spectral peak 307. In FIG. 8, A is the wave value of the spectral peak 307; B is the amplitude of the spectral peak 307; and D is the area of the spectral peak 307.

If the Raman measuring device 203 measured the Raman spectrum at each of two or more measurement points P, the data processing unit 209 calculates an average full width at half maximum (FWHM) $C_{ave}$. The average full width at half maximum (FWHM) $C_{ave}$ is the average value of the full width at half maximum (FWHM) C calculated for each of the Raman spectra measured at two or more measurements points P. For example, if the Raman spectrum is measured at each of the measurement points P1 to P5, the average value of the full width at half maximum (FWHM)s C1 to C5 is the average full width at half maximum (FWHM) $C_{ave}$.

The data processing unit 209 evaluates the degree of color unevenness based on the full width at half maximum (FWHM) C for example. For example, if the full width at half maximum (FWHM) C is broader than 0 $cm^{-1}$ and narrower than a threshold, the data processing unit 209 determines that color unevenness is being inhibited; if the full width at half maximum (FWHM) C is equal to or broader than the threshold, the data processing unit 209 determines that color unevenness is significant. The threshold is, for example, 5.32 $cm^{-1}$. Based on the measurement wave value resolution of commercially available Raman measuring devices, the lower limit value of the full width at half maximum (FWHM) C may be set to 0.5 $cm^{-1}$.

The data processing unit 209 evaluates the degree of color unevenness based on the average full width at half maximum (FWHM) $C_{ave}$ for example. For example, if the average full width at half maximum (FWHM) $C_{ave}$ is broader than 0 $cm^{-1}$ and narrower than the threshold, the data processing unit 209 determines that color unevenness is being inhibited; if the average full width at half maximum (FWHM) $C_{ave}$ is equal to or broader than the threshold, the data processing unit 209 determines that color unevenness is significant. The threshold is, for example, 5.32 $cm^{-1}$. Based on the measurement wave value resolution of commercially available Raman measuring devices, the lower limit value of the average full width at half maximum (FWHM) $C_{ave}$ may be set to 0.5 $cm^{-1}$.

The value of the full width at half maximum (FWHM) increases if the amount of warpage between lattices of silicon nitride is large. It is assumed that the amount of warpage between lattices of silicon nitride varies due to unevenness of nitridization of silicon contained in the sheet-shaped molded body during the process of nitriding. In other words, it is assumed that, if unevenness of nitridization of the silicon nitride substrate 3 is extensive, the amount of warpage between lattices of silicon nitride increases, and thus the value of the full width at half maximum (FWHM) increases.

6. Effect of Silicon Nitride Substrate (6-1) On the silicon nitride substrate of the present disclosure, color unevenness is inhibited, and warpage is reduced.

(6-2) The silicon nitride substrate of the present disclosure have high thermal conductivity.

7. Effect of Evaluation Method for Silicon Nitride Substrate (7-1) According to the evaluation method for silicon nitride substrate of the present disclosure, it is possible to evaluate color unevenness even if the area of the measurement point P is small. Therefore, color unevenness of a small-sized silicon nitride substrate used in, for example, a micro device can be evaluated.

(7-2) According to the evaluation method for silicon nitride substrate of the present disclosure, it is possible to perform fitting on the spectral peak, for example, by using a statistic distribution function and calculate the full width at half maximum (FWHM) of the spectral peak after the fitting. This enables even more accurate calculation of the full width at half maximum (FWHM).

8. Examples (8-1) Manufacture of Silicon Nitride Substrates 3X, 3Y, 3A, 3B

Silicon nitride substrates 3X, 3Y, 3A, 3B were manufactured by using the method disclosed in the aforementioned "2. Manufacturing Method of Silicon Nitride Substrate 3". The silicon nitride substrates 3X, 3Y, 3A, 3B each had a first surface and a second surface. The shape of a plane of each of the silicon nitride substrates 3X, 3Y, 3A, 3B was rectangular. Each of the silicon nitride substrates 3X, 3Y, 3A, 3B had long sides having a length of 200 mm and short sides having a length of 140 mm. The thickness of each of the silicon nitride substrates 3X, 3Y, 3A, 3B was 0.32 mm.

At the time of manufacture of the silicon nitride substrates 3X, 3Y, 3A, 3B, the molar ratio of the rare earth oxides of the silicon nitride substrates 3X, 3Y, 3A, 3B was 1.2 mol % and the molar ratio of the magnesium compound of the silicon nitride substrates 3X, 3Y, 3A, 3B was 9.8 mol %. As mentioned before, the molar ratio of the rare earth oxides is the molar ratio of M1 to the total number of moles in M1, M2, and M3. The molar ratio of the magnesium compound is the molar ratio of M3 to the total number of moles in M1, M2, and M3 as mentioned before.

Figure 14:
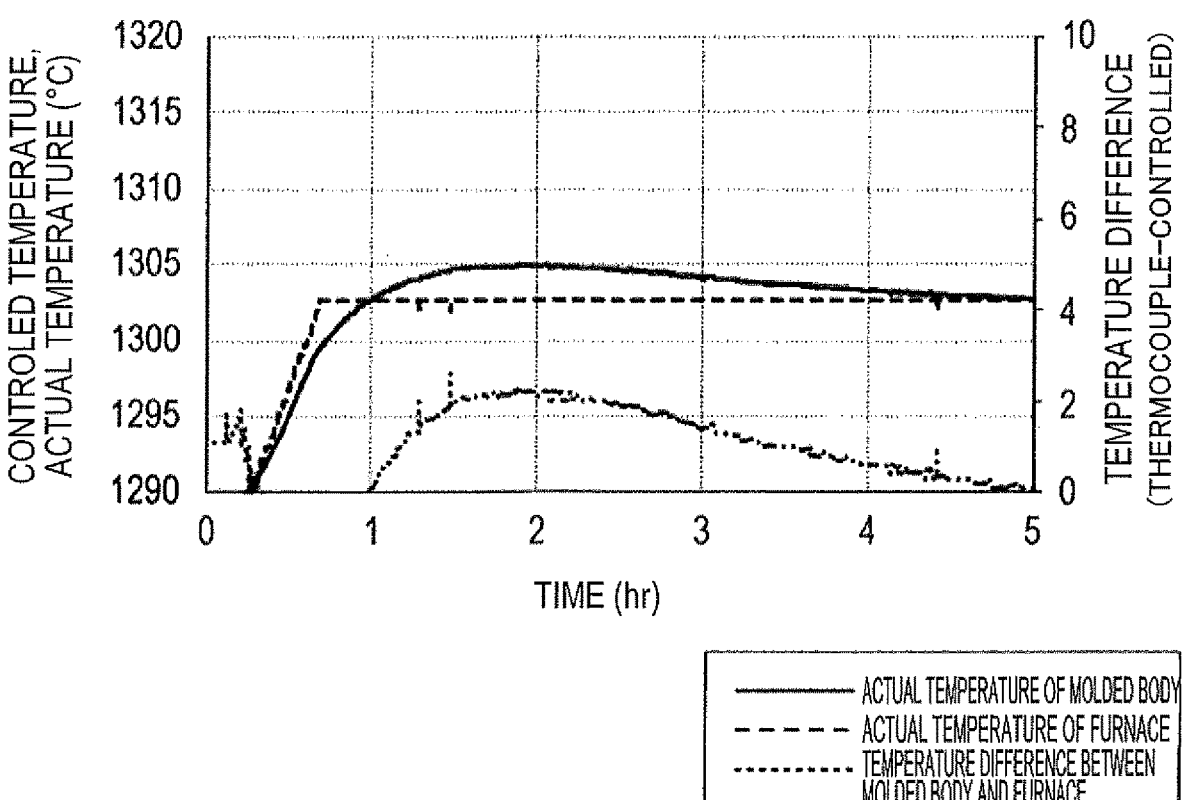
FIG. 14 is a graph showing actual temperatures of a molded body, actual temperatures of a furnace, and temperature differences between the molded body and the furnace in a given temperature range in an example.

In the manufacture of the silicon nitride substrates 3X, 3A, 3B, in the nitriding process S4, the heating temperature was increased to the highest heating temperature in a manner in which the heating temperature was increased stepwise as the heating time passed. The highest heating temperature was 1400° C. The average of the inclination of the heating temperature in a temperature increase in a range from 1270° C. to 1340° C. was 2.99° C./h. FIG. 14 shows the actual temperature of the molded body, the actual temperature of the furnace, and the temperature difference between the molded body and the furnace in a given temperature range in the same lot as the silicon nitride substrate 3X. The horizontal axis in FIG. 14 shows the time elapsed from the reference time, which is the time when the actual temperature of the furnace reaches near 1300° C.; the actual temperature of the furnace is the heating temperature. When the actual temperature of the furnace is near 1300° C., the difference in temperature between the actual temperature of the furnace and the temperature of the molded body in the furnace was 20° C. or less. Since a sharp increase in the temperature of the molded body did not occur in the nitriding process of the silicon nitride substrate 3X that underwent the heat treatment in the same lot, it is assumed that the "thermal runaway" did not occur. Likewise, it is assumed that the "thermal runway" did not occur in the silicon nitride substrates 3A, 3B, since the silicon nitride substrates 3A, 3B underwent the heat treatment under the same temperature increase conditions as the silicon nitride substrate 3X. The silicon nitride substrates 3A, 3B were samples that underwent the heat treatment in the same lot. The silicon nitride substrate 3X was a sample that underwent the heat treatment in a different lot from the silicon nitride substrates 3A, 3B.

Figure 15:
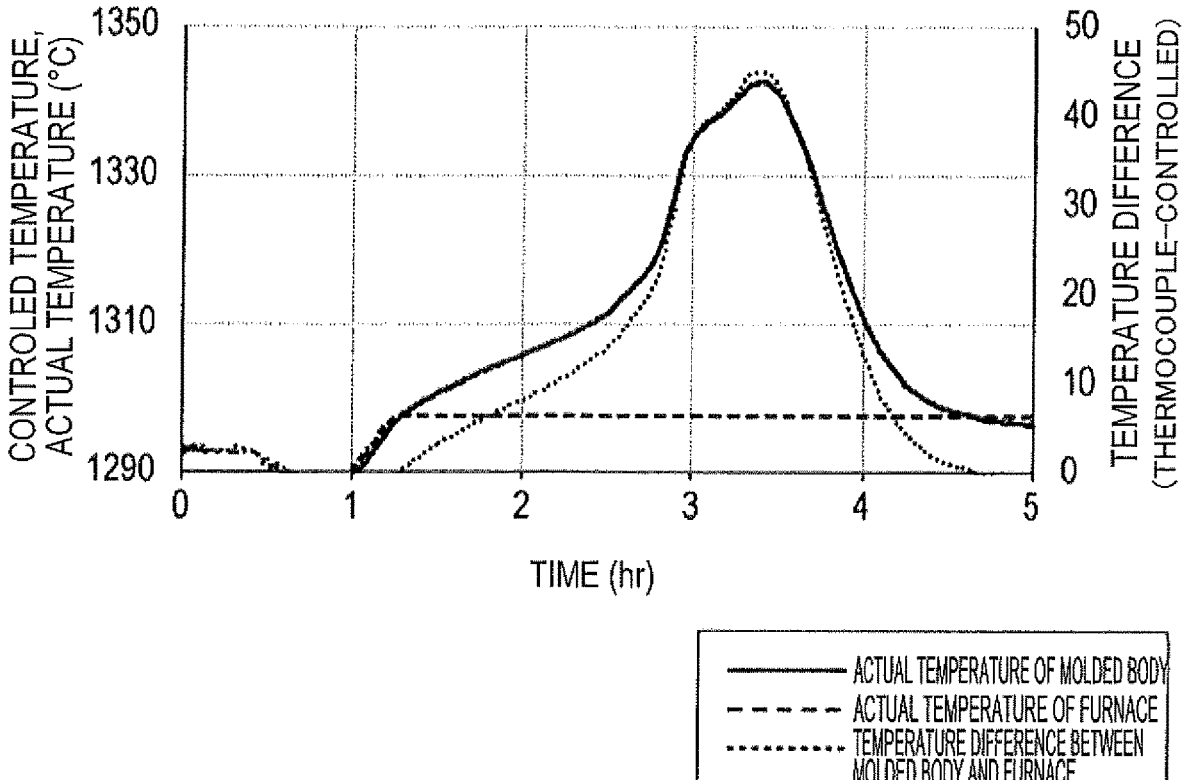
FIG. 15 is a graph showing actual temperatures of molded body, actual temperatures of a furnace, and temperature differences between the molded body and the furnace in a given temperature range in a reference example.

In the manufacture of the silicon nitride substrate 3Y, in the nitriding process S4, the heating temperature was increased to the highest heating temperature in a manner in which the heating temperature was increased stepwise as the heating time passed. The highest heating temperature was 1400° C. The average of the inclination of the heating temperature in a temperature increase in a range from 1270° C. to 1340° C. was 4.67° C./h. FIG. 15 shows the actual temperature of molded body, the actual temperature of the furnace, and the temperature difference between the molded body and the furnace in a given temperature range in the same lot as the silicon nitride substrate 3Y. The horizontal axis in FIG. 15 shows the time elapsed from the reference time, which is the time when the actual temperature of the furnace reaches near 1300° C.; the actual temperature of the furnace is the heating temperature. When the actual temperature of the furnace is near 1300° C., the difference in temperature between the actual temperature of the furnace and the temperature of the molded body in the furnace exceeded 20° C. and reached 44.9° C. at maximum. In other words, it is assumed that a sharp increase in the temperature of the molded body was also experienced in the nitriding process of the silicon nitride substrate 3Y that underwent the heat treatment in the same lot, and the "thermal runway" occurred in the silicon nitride substrate 3Y.

The thermal conductivity of the silicon nitride substrate 3X was 129 W/(m·K). The thermal conductivity of the silicon nitride substrate 3Y was 120 W/(m·K). The thermal conductivity of the silicon nitride substrates 3A, 3B was 124.4 W/(m·K).

(8-2) Evaluation of Color Unevenness

The average full width at half maximum (FWHM) $C_{ave}$ was calculated for each of the silicon nitride substrates 3X, 3Y, 3A, 3B using the method described in the aforementioned "5. Evaluation Method For Silicon Nitride Substrate". The first surface of each of the silicon nitride substrates 3X, 3A, 3B, the first surface of the silicon nitride substrate 3Y, and the second surface of the silicon nitride substrate 3Y were the measurement surfaces 301. On every measurement surfaces 301, the measurement points P were arranged as the measurement points P1 to P5 shown in FIG. 7.

Measurement conditions for Raman spectrum were set as follows.

Raman measuring device: Nanophoton RAMANforce Standard VIS-NIR-HS
  Excitation wavelength: 532.06 nm
  Excitation output density: $1.76×10^6$ W/cm$^2$
  ND filter: 99.23% (240/255)
  Central wavelength of spectroscope: 520.00 cm$^{-1}$ Grating: 1200 gr/mm Slit width: 50 μm Exposure time: 1 sec Averaging: 20 times Objective lens: TU Plan Fluor 5×/NA 0.15

The spectral peak 305 assigned to the lattice vibration of the silicon nitride was set to have the maximum intensity within a range from 850 cm$^{-1}$ or more and 875 cm$^{-1}$ or less. The Lorentzian function was used as the statistic distribution function when performing fitting on the spectral peak 305.

Lightness L*, chromaticity a*, chromaticity b*, and color saturation C* were measured at each of the measurement points P1 to P5. Existence or non-existence of color unevenness on the silicon nitride substrates 3X, 3Y, 3A, 3B were determined by eye observation. A chroma meter (product of Konica Minolta; Product name: CR-400) was used to measure lightness L*, chromaticity a*, chromaticity b*, and color saturation C*. The light source of the chroma meter was a xenon lamp. The diameter of the diameter of measurement was 8 mm. The diameter of the lighting was 11 mm. The method of measuring lightness L*, chromaticity a*, chromaticity b*, and color saturation C* was in accordance with JIS Z 8722. The measurement of lightness L*, chromaticity a*, chromaticity b*, and color saturation C* was carried out under the condition that regular reflection light was included.

The evaluation process includes the process from the measurement of the Raman spectrum to the calculation of the average full width at half maximum (FWHM) C$_{ave}$, and the process of the measurement of lightness L*, chromaticity a*, chromaticity b*, and color saturation C*. The evaluation process on the silicon nitride substrates 3X, 3Y was performed twice. The evaluation process on the silicon nitride substrates 3A, 3B was performed once.

FIG. 9 and FIG. 16 show the wave value A, the amplitude B, the full width at half maximum (FWHM) C, and the area D of the spectral peak 307. The "3X-1" means that the measurement surface 301 is the first surface of the silicon nitride substrate 3X. The "3Y-1" means that the measurement surface 301 is the first surface of the silicon nitride substrate 3Y. The "3Y-2" means that the measurement surface 301 is the second surface of the silicon nitride substrate 3Y. The "3A-1" means that the measurement surface 301 is the first surface of the silicon nitride substrate 3A. The "3B-1" means that the measurement surface 301 is the first surface of the silicon nitride substrate 3B.

FIG. 10 shows lightness L*, chromaticity a*, chromaticity b*, color saturation C*, and full width at half maximum (FWHM) C at each measurement point in the first evaluation process of the silicon nitride substrates 3X, 3Y. FIG. 11 shows lightness L*, chromaticity a*, chromaticity b*, color saturation C*, and full width at half maximum (FWHM) C at each measurement point in the second evaluation process of the silicon nitride substrates 3X, 3Y. FIG. 17 shows lightness L*, chromaticity a*, chromaticity b*, color saturation C*, and full width at half maximum (FWHM) C at each measurement point in the evaluation process of the silicon nitride substrates 3A, 3B. FIG. 10, FIG. 11, and FIG. 17 also show existence or non-existence of color unevenness and an average value of the measured values calculated for each measurement surface.

Figure 12:
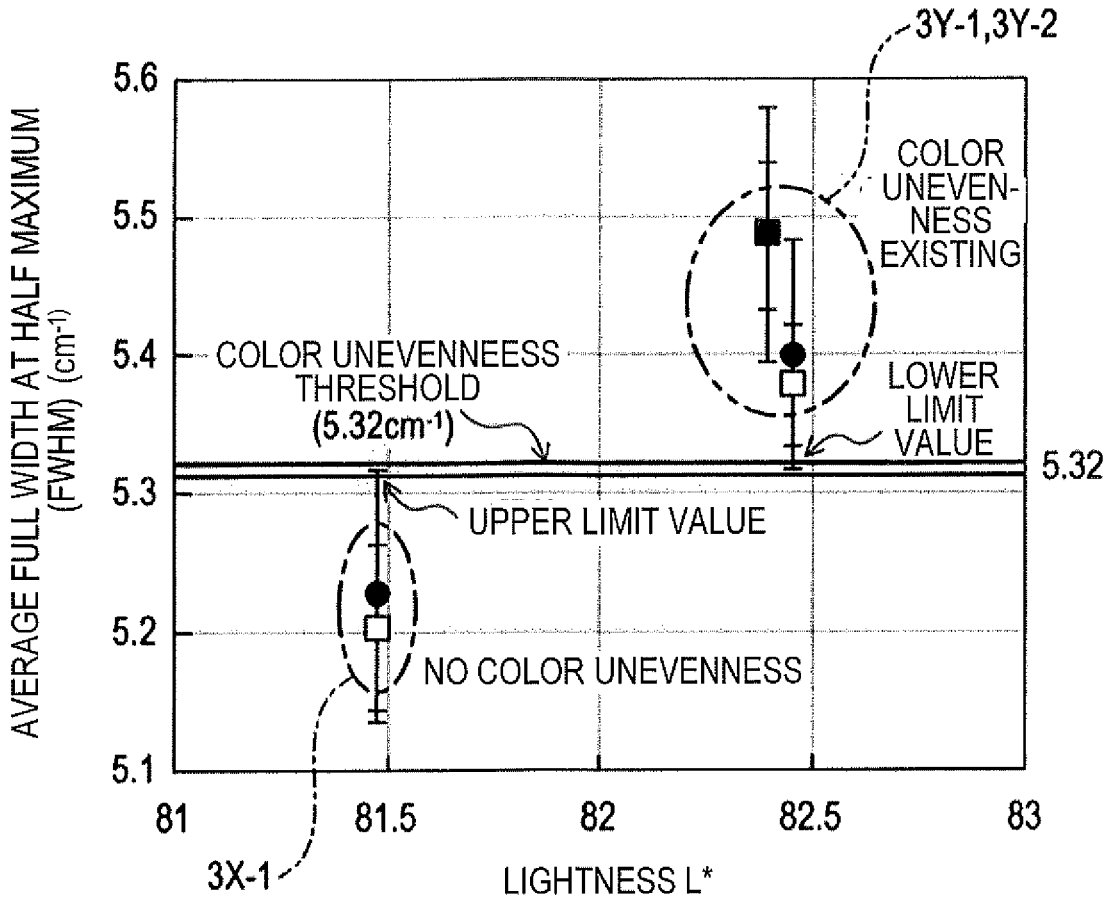
FIG. 12 is a graph showing average full width at half maximum (FWHM)s and lightness L* in the first and second evaluation processes of the silicon nitride substrates 3X, 3Y.
Figure 13:
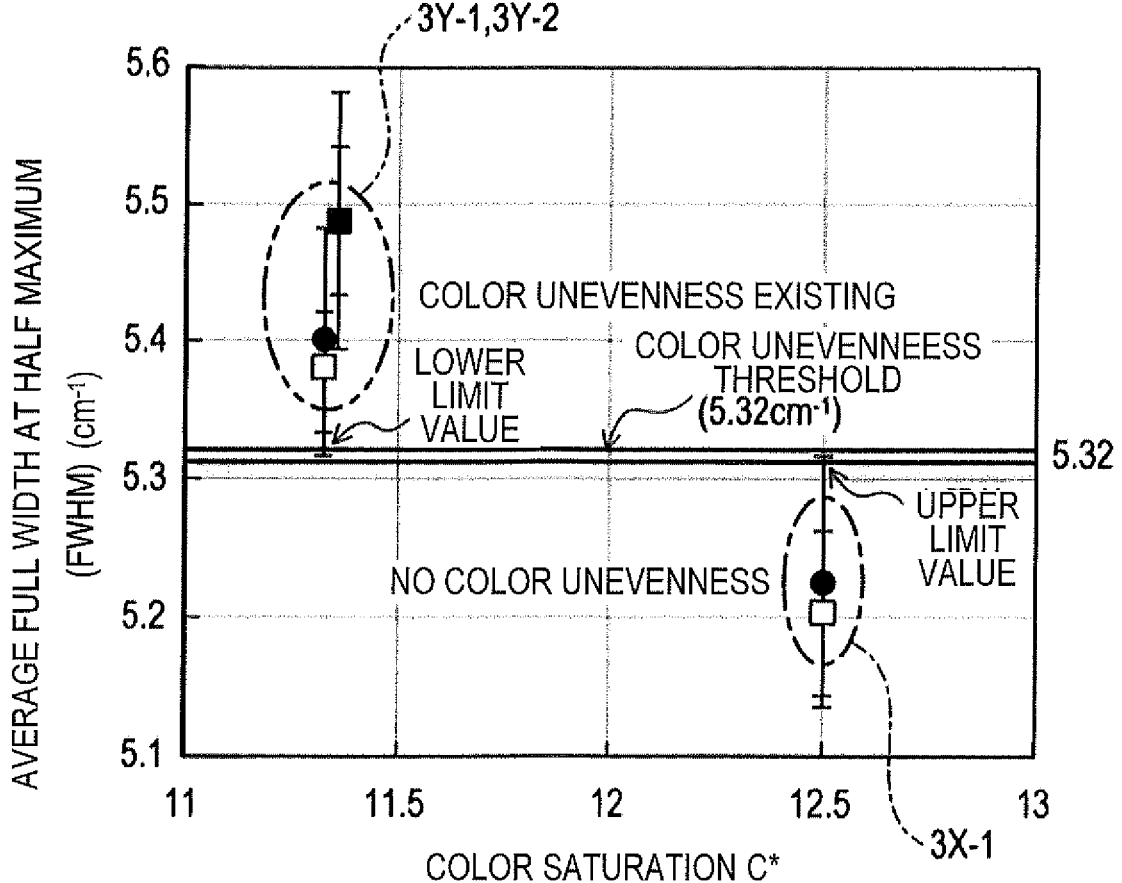
FIG. 13 is a graph showing average full width at half maximum (FWHM)s and color saturation C* in the first and second evaluation processes of the silicon nitride substrates 3X, 3Y.

FIG. 12 shows the average full width at half maximum (FWHM) C$_{ave}$ and lightness L* in the first and the second evaluation processes of the silicon nitride substrates 3X, 3Y. FIG. 13 shows the average full width at half maximum (FWHM) C$_{ave}$ and color saturation C* in the first and the second evaluation processes of the silicon nitride substrates 3X, 3Y. FIG. 12 and FIG. 13 also show a range of the standard deviation of the full width at half maximum (FWHM) C with the average full width at half maximum (FWHM) C$_{ave}$ being the mean.

The average full width at half maximum (FWHM)s C$_{ave}$ of the silicon nitride substrate 3X, 3A, 3B that had no color unevenness were narrower than 5.32 cm$^{-1}$. The average full width at half maximum (FWHM) C$_{ave}$ of the silicon nitride substrate 3Y that had color unevenness was broader than 5.32 cm$^{-1}$. As a result, it was found that there was a relationship between the existence or non-existence of color unevenness and the average full width at half maximum (FWHM) C$_{ave}$. According to these results of the evaluation, it was able to confirm that color unevenness could be evaluated based on the average full width at half maximum (FWHM) C$_{ave}$. It was also able to confirm that color unevenness is inhibited on the silicon nitride substrate that has a small average full width at half maximum (FWHM) C$_{ave}$. On the silicon nitride substrate 3Y, there was only slight color unevenness at one of the four sides of the substrate by eye observation.

(8-3) Evaluation of Warpage

For each of the silicon nitride substrates 3X, 3Y, 3A, 3B, warpage was measured on the first surface and on the second surface. The warpage was measured by using a warpage measurement device manufactured by Softworks Co. Ltd. This warpage measurement device measures the amount of warpage of a plate-shaped measured object by placing three line lasers on the measured object and captures an image thereof by a high-resolution camera. The least square plane of the top surface of the measured object was calculated (defined) by this warpage measurement device. Then, the total of the absolute value of the distance from the calculated least square plane to the highest point of the top surface of the measured object and the absolute value of the distance from the calculated least square plane to the lowest point of the top surface of the measured object was obtained as the amount of warpage. This calculation method was based on the standard of SORI (SEMI M1, ASTM F 1451).

(1) Result of Warpage Measurement on the First Surface

The amount of warpage of the silicon nitride substrate 3X was 0.779 mm; the amount of warpage of the silicon nitride substrate 3Y was 0.999 mm; the amount of warpage of the silicon nitride substrate 3A was 0.840 mm; and the amount of warpage of the silicon nitride substrate 3B was 0.751 mm.

(2) Result of Warpage Measurement on the Second Surface

The amount of warpage of the silicon nitride substrate 3X was 0.653 mm; the amount of warpage of the silicon nitride substrate 3Y was 0.879 mm; the amount of warpage of the silicon nitride substrate 3A was 0.679 mm; and the amount of warpage of the silicon nitride substrate 3B was 0.581 mm.

(3) Examination

The amount of warpage of each of the silicon nitride substrates 3X, 3Y, 3A, 3B satisfies the acceptance criterion, which is "1 mm or less"; however, it was found that the amount of warpage was further reduced to 0.840 mm or less in the silicon nitride substrate 3X, 3A, 3B having the average full width at half maximum (FWHM) C$_{ave}$ of narrower than 5.32 cm$^{1}$.

9. Other Embodiments

Although the embodiments of the present disclosure have been explained above, the present disclosure may be implemented in various forms without being limited to the aforementioned embodiments.

(1) In the evaluation method for silicon nitride substrate of the present disclosure, fitting on the spectral peak using the statistic distribution function does not have to be performed. In this case, the full width at half maximum (FWHM) C of the spectral peak on which fitting was not performed can be measured.

(2) A power module other than the power module 1 can be manufactured using the silicon nitride substrate 3.

(3) Two or more functions of a single element in the aforementioned embodiment may be achieved by two or more elements, and a single function of a single element may be achieved by two or more elements. Two or more functions of two or more elements may be achieved by a single element, and a single function achieved by two or more elements may be achieved by a single element. A part of the configurations of the aforementioned embodiment may be omitted. Furthermore, at least a part of the configurations of the aforementioned embodiment may be added to or replaced with another configuration of the aforementioned embodiment.

(4) Other than the aforementioned evaluation system 201, the present disclosure may be implemented in various forms, such as a higher system having the evaluation system 201 as its component; a program to make a computer function as the evaluation device 205; a non-transitory tangible storage medium such as a semiconductor memory storing this program; and a quality control method for a silicon nitride substrate.

What is claimed is:

1. A sintered silicon nitride substrate comprising:
a plane having a shape that is rectangular;
a plurality of sides, each side having a length equal to or longer than 100 mm;
a sintered substrate material manufactured by nitriding a sheet-shaped molded body that contains silicon;
a first surface; and
a second surface disposed opposite the first surface,
one of the first surface or the second surface being a measurement surface,
on the measurement surface, a value of an average full width at half maximum (FWHM) $C_{ave}$ being broader than 0 cm$^{-1}$ and narrower than 5.32 cm$^{-1}$ as measured by using a measurement method below:
a central portion and first, second, third and fourth edge portions on the measurement surface are determined as measurement points;
the first, second, third and fourth measurement points are each located on the sintered silicon nitride substrate at a distance of 10 mm to an adjacent long side of the sintered silicon nitride substrate and 15 mm to an adjacent short side of the sintered silicon nitride substrate;
a Raman spectrum is measured at each of the measurement points;
a full width at half maximum (FWHM) C of a spectral peak having the maximum strength within a range from 850 cm$^{-1}$ or greater to 875 cm$^{-1}$ or less is calculated in each Raman spectrum; and
an average value of thus calculated FWHMs C is determined as the average FWHM $C_{ave}$.

2. The sintered silicon nitride substrate according to claim 1, wherein thermal conductivity of the sintered silicon nitride substrate is equal to or greater than 110 W/(m·K).

3. The sintered silicon nitride substrate according to claim 1,
wherein an amount of warpage in accordance with a SORI standard is within a range from 0.1 mm to 1 mm.

4. The sintered silicon nitride substrate according to claim 1, wherein a thickness of the sintered silicon nitride substrate is 0.15 mm or greater and 0.8 mm or less.

5. The sintered silicon nitride substrate according to claim 1, further comprising:
a rare earth element oxide and a magnesium compound as sintering aids, and
wherein, when a number of moles of the rare earth element oxide converted into a trivalent oxide is M1, a number of moles of silicon converted into a silicon nitride is M2, and a number of moles of the magnesium compound converted into MgO is M3, a molar ratio of the M1 to a total number of moles of the M1, the M2, and the M3 is 0.5 mol % or greater and less than 2 mol %.

6. A silicon nitride circuit substrate comprising:
a sintered silicon nitride substrate comprising:
a plane having a shape that is rectangular;
a plurality of sides, each side having a length equal to or longer than 100 mm;
a sintered substrate material manufactured by nitriding a sheet-shaped molded body that contains silicon;
a first surface; and
a second surface disposed opposite the first surface,
one of the first surface or the second surface being a measurement surface,
on the measurement surface, a value of an average full width at half maximum (FWHM) $C_{ave}$ being broader than 0 cm$^{-1}$ and narrower than 5.32 cm$^{-1}$ as measured by using a measurement method below:
a central portion and first, second, third and fourth edge portions on the measurement surface are determined as measurement points;
the first, second, third and fourth measurement points are each located on the sintered silicon nitride substrate at a distance of 10 mm to an adjacent long side of the sintered silicon nitride substrate and 15 mm to an adjacent short side of the sintered silicon nitride substrate;
a Raman spectrum is measured at each of the measurement points;
a full width at half maximum (FWHM) C of a spectral peak having the maximum strength within a range from 850 cm$^{-1}$ or greater to 875 cm$^{-1}$ or less is calculated in each Raman spectrum; and
an average value of thus calculated FWHMs C is determined as the average FWHM $C_{ave}$;
a metallic circuit disposed on the first surface of the sintered silicon nitride substrate; and
a metallic radiator plate disposed on the second surface of the sintered silicon nitride substrate.

7. The silicon nitride circuit substrate according to claim 6,
wherein the metallic circuit and the metallic radiator plate are each formed of a copper plate.

* * * * *